(12) United States Patent
Jeon et al.

(10) Patent No.: US 9,112,463 B2
(45) Date of Patent: Aug. 18, 2015

(54) PULSED DYNAMIC LOAD MODULATION POWER AMPLIFIER CIRCUIT

(71) Applicant: Avago Technologies General IP (Singapore) Pte. Ltd., Singapore (SG)

(72) Inventors: Moon-Suk Jeon, Seoul (KR); Jung-Rin Woo, Seoul (KR); Sung-Hwan Park, Seoul (KR); Jung Hyun Kim, Uiwang (KR); Young Kwon, Thousand Oaks, CA (US)

(73) Assignee: Avago Technologies General IP (Singapore) Pte. Ltd.

( * ) Notice: Subject to any disclaimer, the term of this patent is extended or adjusted under 35 U.S.C. 154(b) by 43 days.

(21) Appl. No.: 14/041,414

(22) Filed: Sep. 30, 2013

(65) Prior Publication Data

US 2015/0091649 A1   Apr. 2, 2015

(51) Int. Cl.
*H03G 3/00* (2006.01)
*H03F 3/191* (2006.01)

(52) U.S. Cl.
CPC . *H03G 3/00* (2013.01); *H03F 3/191* (2013.01)

(58) Field of Classification Search
CPC .................................. H03F 3/191; H03F 3/193
USPC .................... 330/284, 302, 305, 306
See application file for complete search history.

(56) References Cited

U.S. PATENT DOCUMENTS

| | | | |
|---|---|---|---|
| 4,115,741 A * | 9/1978 | Skutta | 330/284 |
| 6,353,359 B1 * | 3/2002 | Leizerovich | 330/2 |
| 7,953,380 B2 | 5/2011 | Birafane | |
| 8,254,854 B2 | 8/2012 | Wang et al. | |
| 8,432,224 B1 | 4/2013 | Woo et al. | |
| 2004/0251984 A1 * | 12/2004 | Javor | 333/32 |

OTHER PUBLICATIONS

Jeong, et al. "Pulsed Load Modulation (PLM) Technique for Efficient Power Amplification", IEEE Transactions on Circuits and Systems-II: Express Briefs, vol. 55, No. 10, Oct. 2008.
Liao, et al. "A High Efficiency WCDMA Power Amplifier with Pulsed Load Modulation (PLM)", Department of Electrical Engineering, University of California Los Angeles, Oct. 2010.
Cripps, "RF Power Amplifiers for Wireless Communications", Second Edition, Artech House Boston, p. 318-323.
Umali, et al. "Power Spectral Analysis of the Envelope Pulse-Width Modulation (EPWM) Transmitter for High Efficiency Amplification of OFDM Signals", Vehicular Technology Conference, 2008, VTC Spring 2008, IEEE.

* cited by examiner

Primary Examiner — Steven J Mottola

(57) ABSTRACT

A power amplifier circuit for amplifying an envelope modulated Radio Frequency (RF) signal with improved linearity and efficiency includes a power amplifier, and a variable load matching circuit coupled to an output port of the power amplifier. The input impedance of the variable load matching circuit is changed such that an output power of the power amplifier is at a first output power level, or a second output power level which is higher than the first output power level.

21 Claims, 6 Drawing Sheets

PULSED DYNAMIC LOAD MODULATION POWER AMPLIFIER CIRCUIT

BACKGROUND

The inventive concepts described herein relate to a power amplifier circuit, and more particularly to a power amplifier circuit having improved efficiency and increased linearity by employing a pulsed dynamic load modulation technique.

The wireless communication industry is faced with an increasing demand for wireless communication systems that are capable of achieving a high data transfer rate with limited frequency resources. Accordingly, efforts have been made to optimize the modulation schemes used in wireless communication systems in order to meet the demand. Such optimization of modulation schemes has been devised with a view to achieving an increase in the Peak-to-Average Power Ratio (PAPR) of signals that are to be transmitted by the wireless communication systems.

Unfortunately, a power amplifier transmitting signals with high PAPR inevitably operates in a back-off power region more frequently than a power amplifier transmitting signals with low PAPR in order to maintain good linearity. However, frequent operation in the back-off power region may reduce an operating efficiency of a power amplifier. Accordingly, there has arisen a demand for a power amplifier that is capable of maintaining high efficiency even when operated in a back-off power region while maintaining good linearity.

One technique for avoiding a reduction in efficiency is disclosed in U.S. Pat. No. 8,254,854 entitled "Pulsed Load Modulation Amplifier and Method" issued to Wang et al. on Aug. 28, 2010, which is incorporated herein by reference. The disclosed technique avoids a reduction of efficiency by switching the power amplifier on and off by applying a pulse signal to a gate of the power amplifier. However, because the disclosed circuit uses a λ/4 line for impedance matching, the power amplifier tends to have a narrow bandwidth and is not operational for multi-band or multi-mode applications. Also, in order to recover an amplified original signal from an output modulated signal, the pulse signal for switching the power amplifier should have a frequency ten times higher than that of the modulation signal. This requires a switching frequency of about 50 to 200 MHz for Wideband Code Division Multiple Access (WCDMA) communication using a 3.84 MHz band or Long Term Evolution (LTE) communication using a 20 MHz band. However, since the input impedance of a power transistor in the power amplifier is large, a large current is required to switch the power amplifier on and off with such high frequency. Furthermore, switching noise may be induced during such on and off switching of the power amplifier, which may necessitate the use of a filter to remove the noise. Moreover, because the power amplifier has a narrow dynamic range, it may be difficult to perform precise control for low output power, thereby requiring an additional power control technique for low power levels, especially for the case of a WCDMA transmitter for example which requires precise control of output power as low as −50 dBm.

Accordingly, there has existed a need for a power amplifier circuit capable of overcoming the deficiencies of conventional power amplifiers employing a pulsed load modulation technique.

BRIEF DESCRIPTION OF THE DRAWINGS

The example embodiments will become apparent from the following description of embodiments, given in conjunction with the accompanying drawings, in which.

DETAILED DESCRIPTION

Hereinafter, preferred embodiments of the present invention will be described in detail with reference to the accompanying drawings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

For the purpose of simple and precise understanding, the waveform of an RF carrier wave is not shown. However, those skilled in the art shall appreciate that envelope modulation and/or pulse width modulation are performed on signals that have been modulated with the RF carrier wave.

Figure 1:
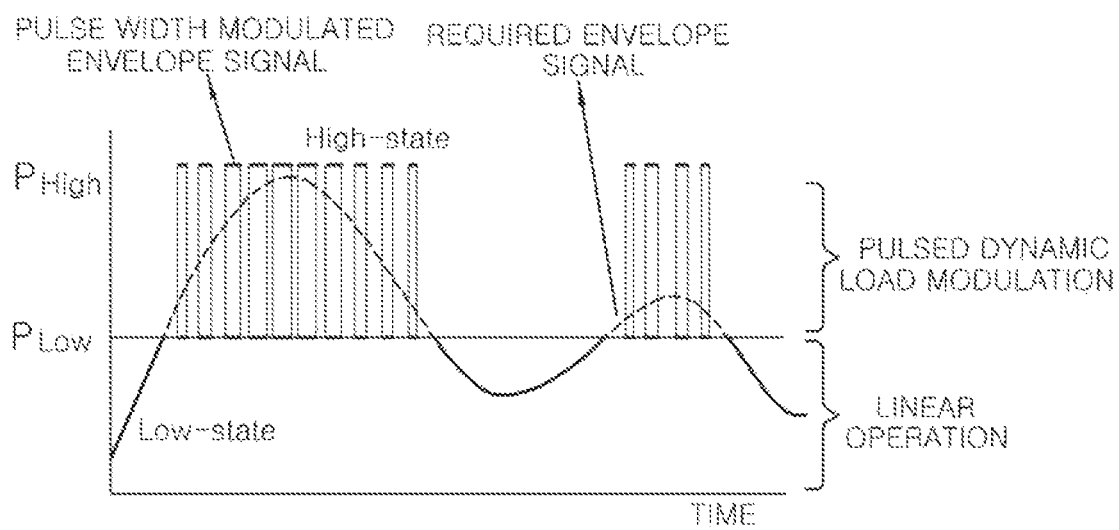
FIG. 1 illustrates an output envelope signal of a power amplifier circuit, according to a representative embodiment.

FIG. 1 illustrates an output envelope signal of a power amplifier circuit, according to a representative embodiment. The dotted line represents a desired output signal. In the case that a linear power amplifier is used, the efficiency of the power amplifier is significantly reduced when the output power is lower than the peak power. In this representative embodiment, a low power level $P_{Low}$ (also referred to herein as the first power level) and a high power level $P_{High}$ (also referred to herein as the second power level) are set, and an input signal which would have resulted in an output power equal to or higher than $P_{Low}$ is transformed to a pulse that has a high state of $P_{High}$ and a low state of $P_{Low}$ at the output port of the power amplifier.

Because the power amplifier of the representative embodiments may operate depending on the pulse width modulation (PWM) signal that has been generated based on the input signal, the width of the output pulse of the power amplifier may be proportional to the final output power. The term "final output" as used herein means an envelope modulated signal recovered from an output pulse, e.g., an output signal of a band pass filter. That is, the resultant signal is, as shown in FIG. 1 with solid line, a PWM signal if the output power is equal to higher than $P_{Low}$, and an envelope modulated signal otherwise. An envelope modulated signal may be recovered from the resultant signal by filtering the output signal of the power amplifier with a band-pass filter to remove the PWM pulse component. This modulation and recovery of the signal improves the efficiency of the power amplifier circuit in a back-off region. In FIG. 1, the dotted line and the solid line are shown as overlapped in the region where the power is lower than $P_{Low}$.

Figure 2A:
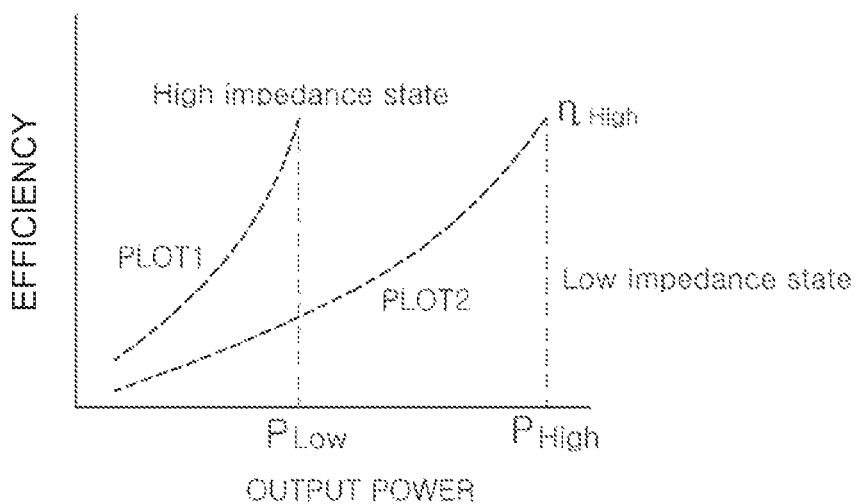
FIG. 2A illustrates exemplary efficiency curves of the power amplifier circuit when a variable load matching circuit that may be included is respectively in a high impedance state and a low impedance state, according to a representative embodiment.

FIG. 2A illustrates exemplary efficiency curves of the power amplifier circuit when a variable load matching circuit that may be included in the power amplifier circuit is respectively in a high impedance state and a low impedance state, according to a representative embodiment. An output port of the power amplifier within the power amplifier circuit may be coupled to the variable load matching circuit, which will be explained in detail below. A dotted line 1 (plot 1 in FIG. 2A) represents an efficiency of the power amplifier circuit when the variable load matching circuit is in a high impedance state, and a dotted line 2 (plot 2 in FIG. 2A) represents an efficiency of the power amplifier circuit when the variable load matching circuit is in a low impedance state. It can be seen from FIG. 2A that for output power less than $P_{Low}$ the efficiency of the power amplifier circuit in the high impedance state of the variable load matching circuit is higher than that in the low impedance state. Accordingly, it would be advantageous to operate the power amplifier in the high impedance state for low output power, and in the low impedance state for high output power. Further, maximum efficiency may be achieved if the power amplifier operates only with output powers $P_{Low}$ and $P_{High}$ which have the highest efficiency for the high and low impedances states, respectively.

By way of changing the load impedance of the power amplifier, for example by adopting a Dynamic Load Modulation (DLM) technique, the power amplifier may operate only with output powers $P_{Low}$ and $P_{High}$ for output power equal to or higher than $P_{Low}$ to achieve maximum efficiency.

DLM may be implemented by switching the variable load matching circuit between the high impedance state and the low impedance state. In this case, an efficiency for output power between $P_{Low}$ and $P_{High}$ may be expressed by the following equation:

$$\eta \cong \eta_{High} \cdot \frac{\left\{D + (1-D) \cdot \frac{1}{\sqrt{m}}\right\}^2}{D + (1-D) \cdot \frac{1}{m}},$$

where $\eta_{High}$ is an efficiency of the power amplifier in the low impedance state for output power $P_{High}$; D is the duty ratio of the resultant pulse; and m is an impedance translation factor that may be characterized as $Re_{Low}$ {real component of $Z_{in}$ for high impedance state}/$Re_{High}$ {real component of $Z_{in}$ for low impedance state} ($Z_{in}$ indicates the input impedance of the variable load matching circuit).

Figure 2B:
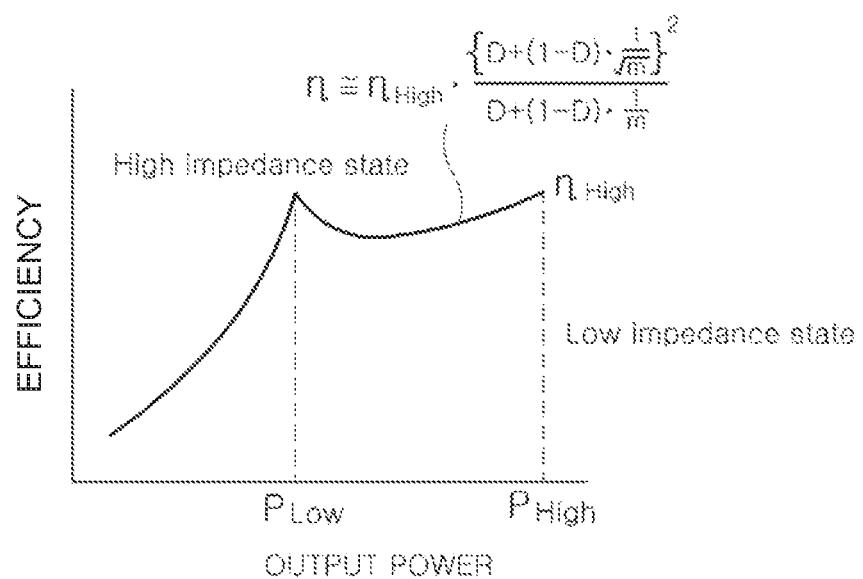
FIG. 2B illustrates an exemplary efficiency curve of the power amplifier circuit when the variable load matching circuit is switched between the high impedance state and the low impedance state, according to a representative embodiment.

In this regard, FIG. 2B illustrates an exemplary efficiency curve of the power amplifier circuit when the variable load matching circuit is switched between the high impedance state and the low impedance state, according to a representative embodiment. The solid line represents the efficiency curve of the power amplifier circuit, where $Z_{in}$ is 7.204+j3.921 for low impedance state and $Z_{in}$ is 31.993+j15.491 for high impedance state. Accordingly, the value of $m=Re_{Low}/Re_{High}$ is 31.993/7.204. As can be seen from FIG. 2B, the efficiency curve of the embodiment is improved compared to that indicated by the dotted lines in FIG. 2A.

Furthermore, it is possible to control the power of the final output signal by applying pulse width modulation to switching of the variable load matching circuit, the pulse width modulation based on the power of the input signal. Specifically, the pulse width of the output pulse varies in proportion to the pulse width of the PWM signal, based on which the input impedance of the variable load matching circuit can be switched. Then the power of the final output varies in proportion to the pulse width of the output pulse. Output power control using pulse width modulation is disclosed in, for example, S. C. Cripps (1999), RF Power Amplifiers for Wireless Communication, Northwood, Mass., Artech House, which is incorporated by reference herein.

The power amplifier circuit of the representative embodiments may be referred to as using Pulsed Dynamic Load Modulation (PDLM), because it adopts a DLM technique while its output is in the form of PWM pulse.

Figure 3:
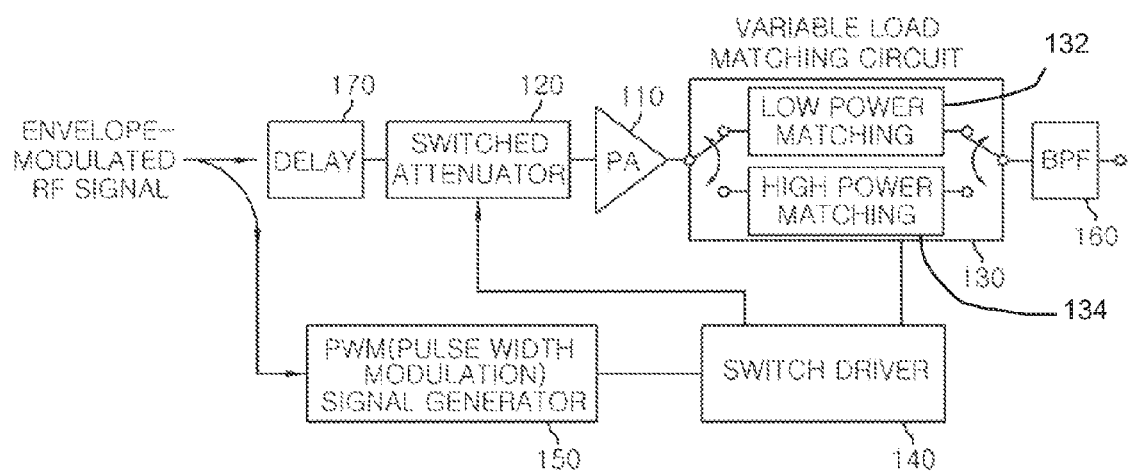
FIG. 3 is a block diagram illustrating a power amplifier circuit, according to a representative embodiment.

Turning now to FIG. 3 which illustrates a block diagram of a power amplifier circuit according to a representative embodiment, the power amplifier circuit may include a power amplifier (PA) 110, a switched attenuator 120 coupled to the input port of the PA 110, and a variable load matching circuit 130 coupled to the output port of the PA 110. The variable load matching circuit 130 may be provided for implementing dynamic load modulation (DLM) by being switched between a high impedance state (or low power matching state) 132 as shown and a low impedance state (or high power matching state) 134 as also shown, to change the impedance characteristics of the PA 110. Due to such switching, the PA 110 operates only with output powers $P_{Low}$ and $P_{High}$ to thereby attain a high efficiency.

The switched attenuator 120 changes the gain of the power amplifier circuit so that the PA 110 can operate in a saturation region. Specifically, in order for the PA 110 to operate only with the output power $P_{Low}$ or $P_{High}$, it is desirable that the PA 110 operates in a saturation region. However, given that the PA 110 is in a saturation mode for output power $P_{Low}$, additional power of $P_{High}$-$P_{Low}$ should be needed by the PA 110 to also operate in the saturation mode for output power $P_{High}$. To this end, the switched attenuator 120 allows the PA 110 to have higher RF gain for output power $P_{High}$ so that the PA 110 operates in the saturation mode for output power $P_{High}$.

A PWM signal generated by PWM signal generator 150 responsive to the input envelope modulated RF signal may be provided to the switched attenuator 120 and/or the variable load matching circuit 130 to control the switching of the switched attenuator 120 and/or the variable load matching circuit 130. Accordingly, the gain change by the switched attenuator 120 and the impedance change by the variable load matching circuit 130 may be synchronized. Further, because the switching of the switched attenuator 120 and/or the variable load matching circuit 130 is based on the PWM signal, the pulse width of the pulse output from the PA 110 may be proportional to the power of the input signal. Accordingly, the input envelope modulated RF signal can be recovered by filtering the pulsed output signal with a band-pass filter (BPF) 160.

A switch driver 140 may be placed between the PWM signal generator 150, and the switched attenuator 120 and the variable load matching circuit 130. Since the PWM signal generated by the PWM signal generator 150 is transmitted to the switched attenuator 120 and/or the variable load matching circuit 130 through the switch driver 140, it is possible to minimize current consumption by the PWM signal generator 150.

In addition, a delay 170 may be connected at the input end of the switched attenuator 120 to appropriately delay the input envelope modulated RF signal, to compensate for the time necessary for the PWM signal generator 150 to generate the PWM signal responsive to the input envelope modulated RF signal and for the time necessary for the switch driver 140 to switch the switched attenuator 120 and/or the variable load matching circuit 130, thereby controlling the timing of switching for the switched attenuator 120 and the variable load matching circuit 130.

Because the circuit shown in FIG. 3 does not include a bandwidth-limiting component such as a λ/4 transmission line, it can be used for multi-band and/or wide-band applications. Further, difficulty in implementing fast switching can be resolved and switching noise can be reduced, since the PA 110 is not switched. In addition, the PA 110 operates as a typical linear PA when the output power is lower than $P_{Low}$, and exhibits good linearity and efficiency.

Figure 4:
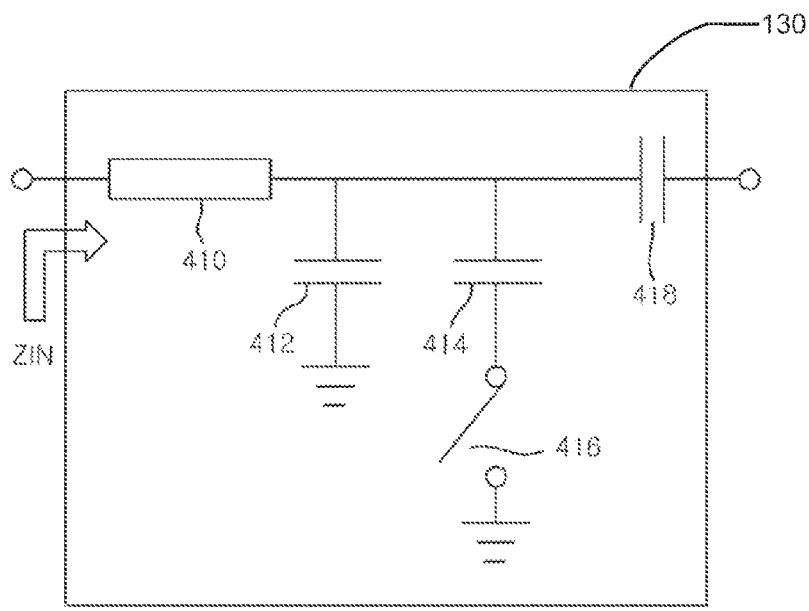
FIG. 4 is a diagram illustrating a variable load matching circuit of the power amplifier circuit, according to a representative embodiment.

FIG. 4 is a diagram illustrating a variable load matching circuit 130 of the power amplifier circuit, according to a representative embodiment. The variable load matching circuit 130 may include a load 410 coupled to the PA 110 (FIG. 3) and first and second shunt capacitors 412, 414 connected to the load 410. A switch 416 is disposed between the second shunt capacitor 414 and ground, and the second shunt capacitor 414 is connected to and disconnected from ground according to the switching of the switch 416. A series capacitor 418 is also connected to the load 410. Switch 416 may be controlled responsive to the PWM signal provided by switch driver 140.

Connecting and disconnecting the second shunt capacitor 414 to ground via switch 416 changes input impedance Zin of the variable load matching circuit 130. Specifically, when the switch 416 is on, the second shunt capacitor 414 is connected to ground, and the variable load matching circuit 130 goes into the low (first) impedance state (i.e., reduced Zin). Thus the output power of the PA 110 becomes $P_{High}$ (first power level). On the other hand, when the switch 416 is off, the variable load matching circuit 130 goes into the high (second) impedance state (i.e., increased Zin), and the output power of the PA 110 becomes $P_{Low}$ (first power level). In a representative embodiment, the capacitances of the first shunt capacitor 412, the second shunt capacitor 414 and the series capacitor 418 may respectively be 2 pF, 6.2 pF and 100 pF, although other capacitances may be used.

Figure 5:
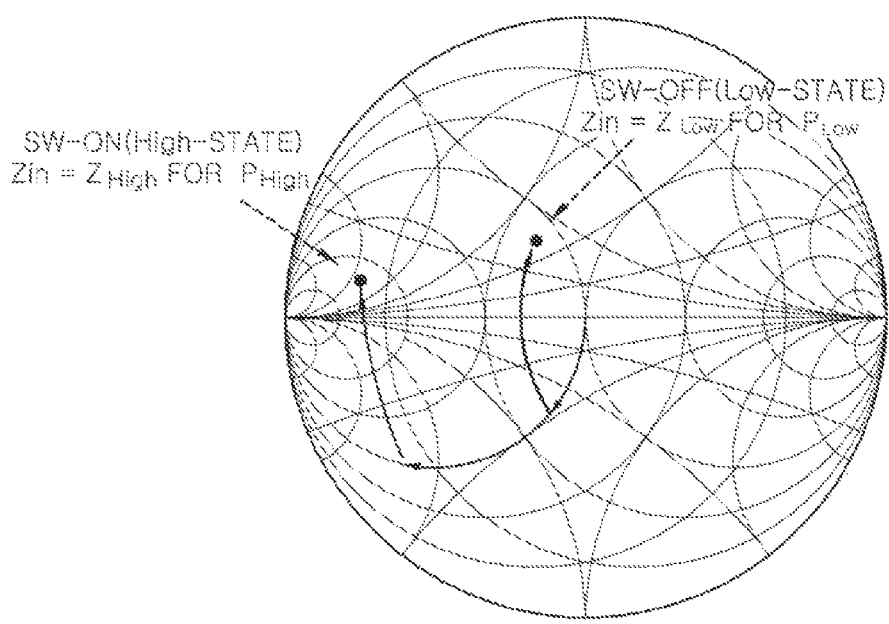
FIG. 5 illustrates an impedance locus of the variable load matching circuit shown in FIG. 3.

FIG. 5 illustrates an impedance locus of the variable load matching circuit 130 shown in FIG. 3. The locus is for the input impedance of the variable load matching circuit 130 in the case where the first shunt capacitor 412 has a capacitance of 1 pF, the second shunt capacitor 414 has a capacitance of 7 pF, and the series capacitor 418 has a capacitance of 100 pF. FIG. 5 shows that the variable load matching circuit 130 shown in FIG. 4 is in a low impedance state ($Z_{in}$=7.204+ j3.921) when the switch 416 is on, and in a high impedance state ($Z_{in}$=31.993+j15.491) when the switch 416 is off.

Figure 6:
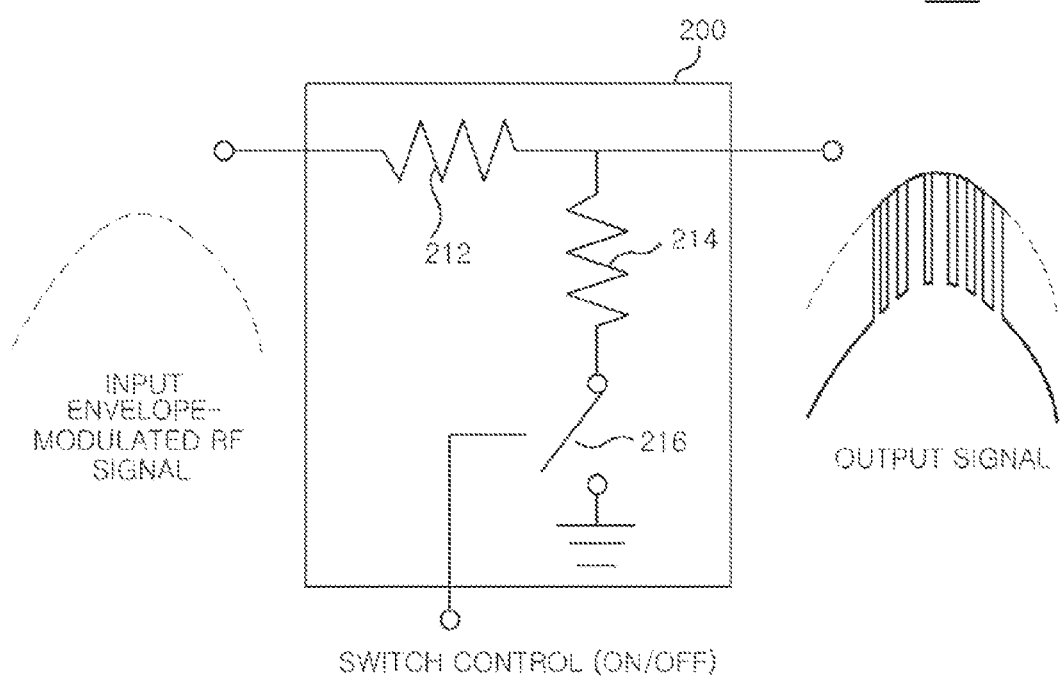
FIG. 6 is a diagram illustrating a switched attenuator of the power amplifier circuit, according to a representative embodiment.

FIG. 6 is a diagram illustrating a switched attenuator 120 of the power amplifier circuit, according to a representative embodiment. The switched attenuator 120 changes its gain via switching. Specifically, the switched attenuator 120 may include a gain adjusting circuit 200 including a series resistor 212, a shunt resistor 214, and a switch 216 connected between the shunt resistor 214 and ground. When the switch 216 is off, only the series resistor 212 is connected to the PA 110 (FIG. 3). However, when the switch 216 is on, both the series resistor 212 and the shunt resistor 214 are connected to the PA 110, and reduced input power is provided to the PA 110.

Accordingly, when an input envelope signal as shown by the dotted line in FIG. 6 is provided to the switched attenuator 120, during the time when switch 216 is on, reduced input power is output to the PA 110 while higher (i.e., unchanged) input power is output to the PA 110 when the switch 216 is off, as indicated by the solid line in the output signal shown in FIG. 6. Additionally, the switch 216 may operate based on the PWM signal from the PWM signal generator 150 (FIG. 3) to create a PWM modulated output signal. In a representative embodiment, series resistor 212 may be excluded so that the gain adjusting circuit 200 may include the shunt resistor 214 and the switch 216. In another representative embodiment, the shunt resistor 214 may be 10 Ω resistor.

Figure 7:
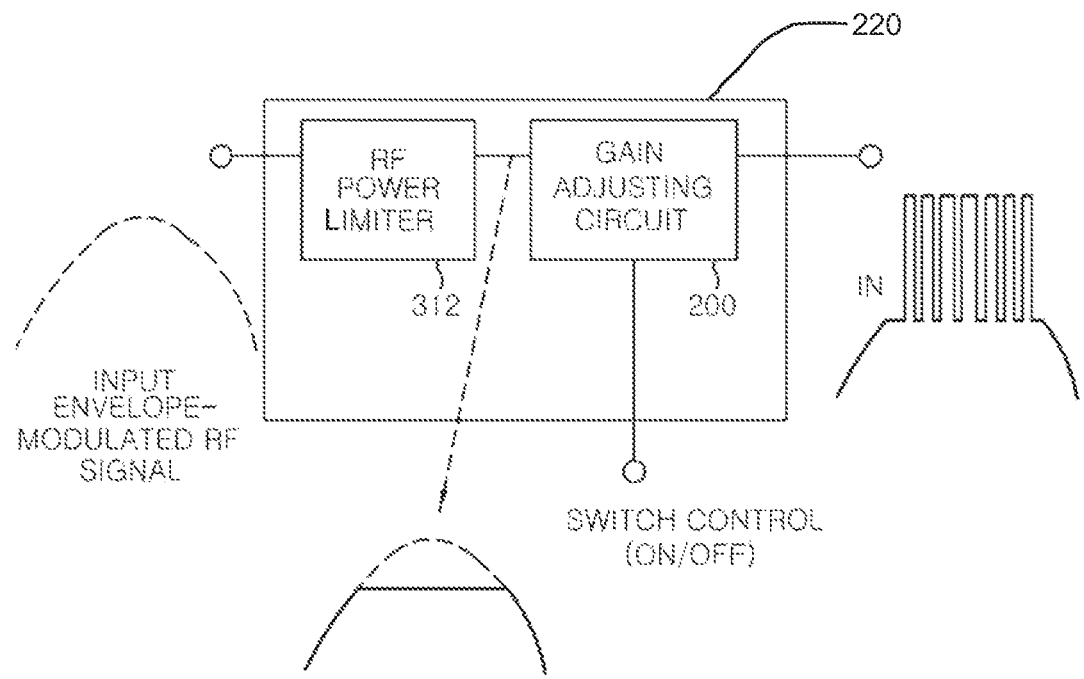
FIG. 7 is a block diagram illustrating a switched attenuator usable as the switched attenuator of the power amplifier circuit, according to a representative embodiment.

FIG. 7 is a block diagram illustrating a switched attenuator 220 usable as the switched attenuator of the power amplifier circuit, according to a representative embodiment. The gain of the switched attenuator 220 is changed by switching. Specifically, the switched attenuator 220 may include a RF power limiter 312 for limiting output power of the switched attenuator 220 to a predetermined level. RF power limiter 312 is coupled to provide an output to the gain adjusting circuit 200 as shown in FIG. 6. Because the input envelope modulated RF signal is cropped by the RF power limiter 312 and then provided to the gain adjusting circuit 200, the output power of the switched attenuator 220 may be flat in the higher power region. This may result in a more pulse-like output from the power amplifier circuit.

Figure 8:
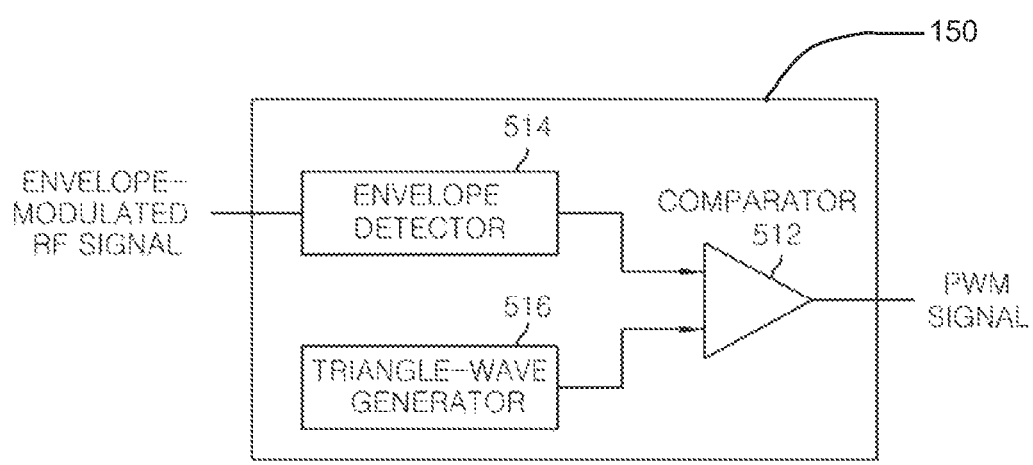
FIG. 8 is a block diagram illustrating a pulse width modulation (PWM) signal generator of the power amplifier circuit, according to a representative embodiment.

FIG. 8 is a block diagram illustrating the pulse width modulation (PWM) signal generator 150 of the power amplifier circuit, according to a representative embodiment. The PWM signal generator 150 may include an envelope detector 514, which receives the input envelope modulated RF signal and provides an output to a comparator 512. The comparator 512 compares a signal from the envelope detector 514 with a signal from the triangle-wave generator 516 to generate an output. For example, when the output signal from the envelope detector 514 is larger than the output signal from the triangle-wave generator 516 the comparator 512 outputs a high signal, and otherwise the comparator 512 outputs a low signal. Accordingly, a pulse (i.e., PWM signal) that has a pulse width proportional to the power of the input envelope modulated RF signal may be generated.

In another representative embodiment, PWM signal generator 150 may be implemented as including a delta-sigma modulator, an example of which is disclosed in Umali, E. M et al., Power Spectral Analysis of the Envelope Pulse-Width Modulation (EPWM) Transmitter for High Efficiency Amplification of OFDM Signals, Vehicular Technology Conference, 2008, VTC Spring 2008, IEEE, which is incorporated herein by reference.

Figure 9:
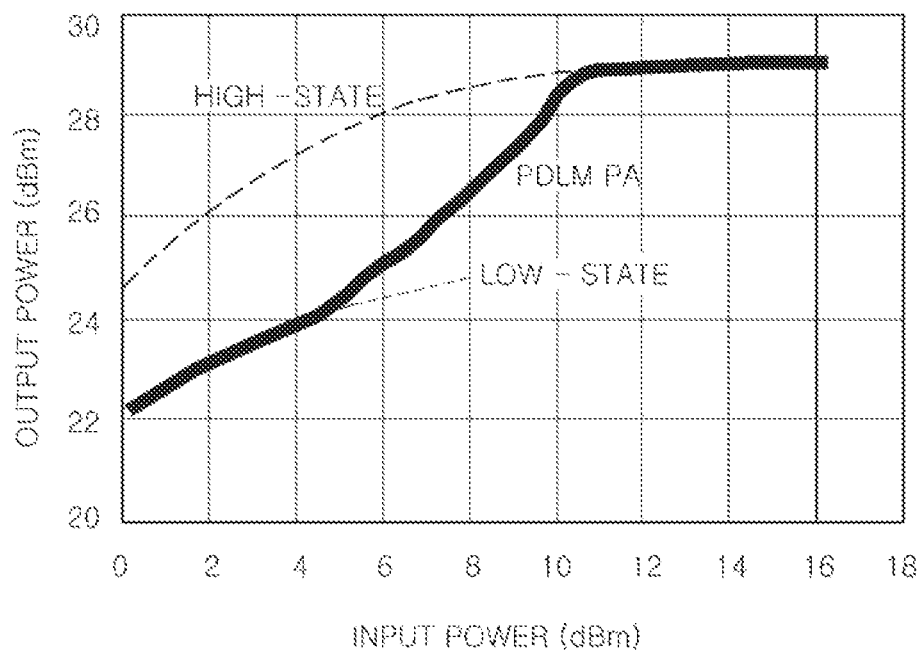
FIG. 9 is an exemplary graph depicting an output power curve versus input power for the power amplifier circuit, according to a representative embodiment.

FIG. 9 is an exemplary graph depicting an output power curve versus input power for the power amplifier circuit, according to a representative embodiment. In FIG. 9, two dotted lines show output power curves when the variable load matching circuit 130 is respectively in a high impedance state and a low impedance state, and the solid line shows an output power curve when the variable load matching circuit 130 is switched between the high impedance state and the low impedance state. As shown by the solid line, the output power increases as the input power increases while linearity between the output power and the input power is maintained.

Figure 10:
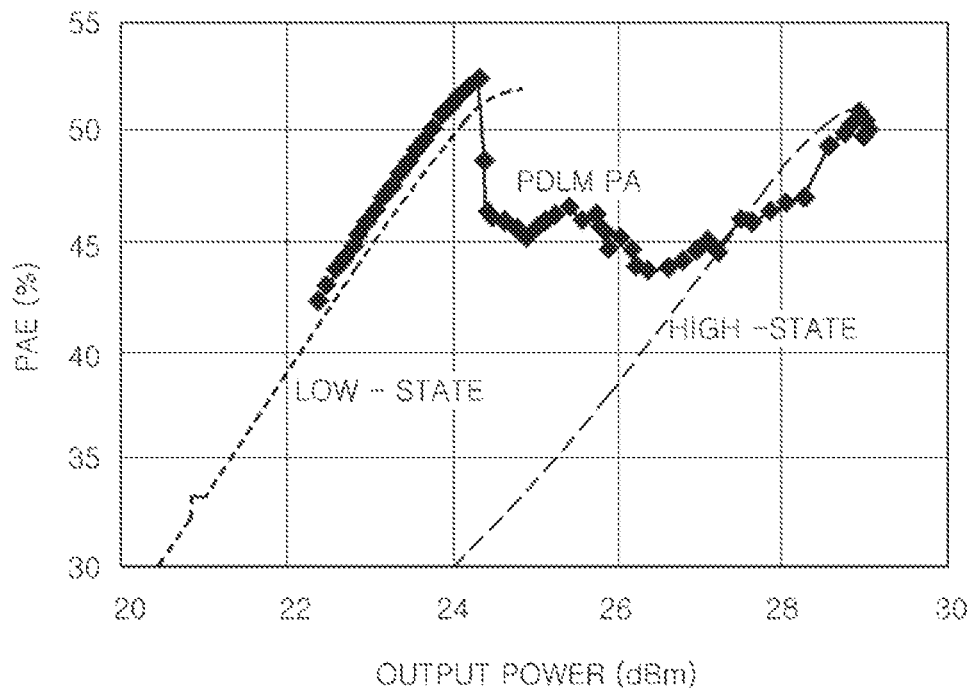
FIG. 10 is an exemplary graph depicting a Power-Added Efficiency (PAE) curve versus output power for the power amplifier circuit, according to a representative embodiment.

FIG. 10 is an exemplary graph depicting a Power-Added Efficiency (PAE) curve versus output power for the power amplifier circuit, according to a representative embodiment. In FIG. 10, two dotted lines show PAE curves when the variable load matching circuit 130 is respectively in a high impedance state and a low impedance state, and the solid line shows an output power curve when the variable load matching circuit 130 is switched between the high impedance state and the low impedance state. The solid line shows that in the power amplifier circuit according to the representative embodiments, the PAE remains relatively high over the entire output power range, compared to that shown with dotted lines.

According to the disclosed embodiments, the power amplifier operates only with output power that maximizes its efficiency, resulting in improved efficiency. Further, because the power amplifier does not need to be turned on or off, switching can be done with high frequency, and switching noise may be avoided. Moreover, when output power is below the predetermined level (i.e., $P_{Low}$), the power amplifier operates like typical linear power amplifier. Also, because a bandwidth-limiting component is not used, the power amplifier circuit can be used for multi-band and/or wide-band applications.

Although certain specific embodiments have been described herein, they are intended to be exemplary only for the purpose of facilitating those skilled in the art to understand the invention, and not to limit the scope of the invention. Each of the components or elements referred to herein may be implemented as a single component or as a combination of two or more. Thus, the above description is not to be construed as limiting the scope of the invention, and the scope of the invention is intended to be defined only by the claims that follow.

What is claimed is:

1. A power amplifier circuit, comprising:
a power amplifier configured to amplify an envelope modulated radio frequency (RF) signal; and
a variable load matching circuit coupled to an output port of the power amplifier, the variable load matching circuit configured to have an input impedance that is changeable so that an output power of the power amplifier changes between a first output power level and a second output power level which is higher than the first output power level, wherein the variable load matching circuit is configured to change the input impedance depending on a pulse width of a pulse width modulation (PWM) signal; and
a band-pass filter coupled to an output port of the variable load matching circuit, wherein an output power of the band-pass filter changes responsive to the input impedance of the variable load matching circuit.

2. The power amplifier circuit of claim 1, wherein the variable load matching circuit is configured so that the input impedance is high when the output power of the power amplifier is at the first output power level and low when the output power of the power amplifier is at the second output power level.

3. The power amplifier circuit of claim 1, wherein the variable load matching circuit comprises a shunt capacitor and a switch configured to switch the shunt capacitor.

4. The power amplifier circuit of claim 1, further comprising a pulse width modulation (PWM) signal generator configured to generate a PWM signal, wherein the input impedance of the variable load matching circuit is switched based on the PWM signal.

5. A method of amplifying an envelope modulated Radio Frequency (RF) signal using a power amplifier, comprising:
changing an impedance coupled to an output port of the power amplifier, so that an output power of the power amplifier changes between a first output power level and a second output power level, which is higher than the first output power level, wherein the impedance coupled to the input port of the power amplifier is changed based on a pulse width modulation signal; and
changing an impedance coupled to an input port of the power amplifier so that the power amplifier operates in a saturation region.

6. The method of claim 5, wherein the impedance coupled to the output port is changed to be high when the output power is at the first output power level and low when the output power is at the second output power level.

7. The method of claim 5, wherein the impedance coupled to the output port of the power amplifier is changed based on a pulse width modulation signal.

8. A power amplifier circuit, comprising:
an attenuator configured to adjustably attenuate an envelope modulated radio frequency (RF) signal;
a power amplifier configured to amplify an output of the attenuator;
a variable load matching circuit connected to an output of the power amplifier, the variable load matching circuit configured to have a variable input impedance that is switchable between a first impedance state and a second impedance state so that an output power level of the power amplifier switches between a first power level and a second power level that is greater than the first power level; and
a filter configured to recover the envelope modulated RF signal responsive to an output of the variable load matching circuit.

9. The power amplifier circuit of claim 8, further comprising:
a pulse width modulation (PWM) signal generator configured to generate a PWM signal responsive to the envelope modulated RF signal,
wherein the attenuator is configured to adjust attenuation and the variable load matching circuit is configured to switch the variable input impedance responsive to the PWM signal.

10. The power amplifier circuit of claim 8, wherein the attenuator comprises a gain adjusting circuit including a shunt resistor and a switch configured to switch the shunt resistor.

11. The power amplifier circuit of claim 8, wherein the attenuator comprises:
a power limiter configured to limit power of the envelope modulated RF signal so as not to be higher than a predetermined power level; and
a gain adjusting circuit connected to an output of the power limiter and including a shunt resistor and a switch configured to switch the shunt resistor.

12. The power amplifier circuit of claim 8, wherein the variable load matching circuit is configured so that the input impedance is high when the output power level of the power amplifier is at the first power level and low when the output power level of the power amplifier is at the second power level.

13. The power amplifier circuit of claim 8, wherein the variable load matching circuit comprises a shunt capacitor and a switch configured to switch the shunt capacitor.

14. A power amplifier circuit, comprising:
   a power amplifier configured to amplify an envelope modulated radio frequency (RF) signal;
   a variable load matching circuit coupled to an output port of the power amplifier, the variable load matching circuit configured to have an input impedance that is changeable so that an output power of the power amplifier changes between a first output power level and a second output power level which is higher than the first output power level;
   an attenuator coupled to an input port of the power amplifier, the attenuator comprising: a power limiter configured to limit power of an input signal so as not to be higher than a predetermined power level; and a gain adjusting circuit connected to an output of the power limiter and including a shunt resistor and a switch configured to switch the shunt resistor, wherein attenuator is configured to change a gain of the power amplifier so that the power amplifier operates in a saturation region.

15. The power amplifier circuit of claim 14, wherein the variable load matching circuit is configured so that the input impedance is high when the output power of the power amplifier is at the first output power level and low when the output power of the power amplifier is at the second output power level.

16. The power amplifier circuit of claim 14, wherein the variable load matching circuit comprises a shunt capacitor and a switch configured to switch the shunt capacitor.

17. The power amplifier circuit of claim 14, further comprising a pulse width modulation (PWM) signal generator configured to generate a PWM signal, wherein the input impedance of the variable load matching circuit is switched based on the PWM signal.

18. A power amplifier circuit, comprising:
   a power amplifier configured to amplify an envelope modulated radio frequency (RF) signal;
   a variable load matching circuit coupled to an output port of the power amplifier, the variable load matching circuit configured to have an input impedance that is changeable so that an output power of the power amplifier changes between a first output power level and a second output power level which is higher than the first output power level;
   an attenuator coupled to an input port of the power amplifier, the attenuator configured to change a gain of the power amplifier so that the power amplifier operates in a saturation region; and
   a pulse width modulation (PWM) signal generator configured to generate a PWM signal, wherein the attenuator switches the gain of the power amplifier based on the PWM signal.

19. The power amplifier circuit of claim 18, wherein the variable load matching circuit is configured so that the input impedance is high when the output power of the power amplifier is at the first output power level and low when the output power of the power amplifier is at the second output power level.

20. The power amplifier circuit of claim 18, wherein the variable load matching circuit comprises a shunt capacitor and a switch configured to switch the shunt capacitor.

21. The power amplifier circuit of claim 18, wherein the attenuator comprises a gain adjusting circuit including a shunt resistor and a switch configured to switch the shunt resistor.

* * * * *